US011705533B2

(12) United States Patent
Cho

(10) Patent No.: US 11,705,533 B2
(45) Date of Patent: Jul. 18, 2023

(54) PHOTOSENSITIVE COMPONENT, X-RAY DETECTOR AND DISPLAY DEVICE

(71) Applicant: HKC CORPORATION LIMITED, Shenzhen (CN)

(72) Inventor: En-tsung Cho, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 203 days.

(21) Appl. No.: 17/257,632

(22) PCT Filed: Dec. 27, 2019

(86) PCT No.: PCT/CN2019/129339
§ 371 (c)(1),
(2) Date: Jan. 4, 2021

(87) PCT Pub. No.: WO2020/143487
PCT Pub. Date: Jul. 16, 2020

(65) Prior Publication Data
US 2021/0273128 A1 Sep. 2, 2021

(30) Foreign Application Priority Data

Jan. 11, 2019 (CN) .......................... 201910038703.6

(51) Int. Cl.
*H01L 31/118* (2006.01)
*H01L 31/115* (2006.01)
*G06F 1/16* (2006.01)

(52) U.S. Cl.
CPC .......... *H01L 31/118* (2013.01); *G06F 1/1684* (2013.01); *H01L 31/115* (2013.01)

(58) Field of Classification Search
CPC ... G01T 1/24; G06F 1/1684; H01L 27/14658; H01L 31/105; H01L 31/115; H01L 31/118; H01L 2924/12031; H01L 29/868; H01L 29/6603; H01L 29/6606; H01L 29/6609; H01L 29/66204
See application file for complete search history.

(56) References Cited

U.S. PATENT DOCUMENTS

| 9,219,184 | B2 * | 12/2015 | Huang | H01L 31/02027 |
| 9,535,346 | B2 | 1/2017 | Sekiya et al. | |
| 2003/0010923 | A1 * | 1/2003 | Zur | G01T 1/2018 |
| | | | | 348/E5.086 |
| 2004/0135209 | A1 | 7/2004 | Hsieh et al. | |
| 2005/0285044 | A1 * | 12/2005 | Mollov | G01T 1/2018 |
| | | | | 250/370.11 |
| 2015/0053863 | A1 | 2/2015 | Cao | |
| 2015/0270353 | A1 * | 9/2015 | Shimizu | H01L 21/0455 |
| | | | | 438/572 |
| 2016/0126381 | A1 * | 5/2016 | Wang | H01L 31/022408 |
| | | | | 257/429 |
| 2017/0047449 | A1 * | 2/2017 | Takechi | H01L 27/14689 |
| 2018/0274973 | A1 * | 9/2018 | Rogers | G01J 5/10 |

FOREIGN PATENT DOCUMENTS

| CN | 101308856 A | 11/2008 |
| CN | 101661137 A | 3/2010 |
| CN | 104900669 A | 9/2015 |
| CN | 106910796 A | 6/2017 |
| CN | 108198894 A | 6/2018 |
| CN | 109860330 A | 6/2019 |
| WO | 2018108403 A1 | 6/2018 |

OTHER PUBLICATIONS

First Office Action in counterpart Chinese Patent Application No. 201910038703.6, dated May 15, 2020.
International Search Report and Written Opinion in corresponding PCT Application No. PCT/CN2019/129339, dated Mar. 27, 2020.
Second Office Action in counterpart Chinese Patent Application No. 201910038703.6, dated Nov. 24, 2020.

* cited by examiner

*Primary Examiner* — Calvin Y Choi
(74) *Attorney, Agent, or Firm* — Westbridge IP LLC

(57) ABSTRACT

Disclosed is a photosensitive component, including: an intrinsic layer; a first doped layer provided on a light incident side of the intrinsic layer; and a second doped layer provided on a light exit side of the intrinsic layer; the intrinsic layer, the first doped layer and the second doped layer are all doped with a dopant, and silicon ions are injected into the intrinsic layer, the first doped layer and the second doped layer. An X-ray detector and a display device are further disclosed.

15 Claims, 3 Drawing Sheets

PHOTOSENSITIVE COMPONENT, X-RAY DETECTOR AND DISPLAY DEVICE

CROSS-REFERENCE TO RELATED APPLICATIONS

This application is the National Stage of International Application No. PCT/CN2019/129339, filed on Dec. 27, 2019, which claims priority to Chinese Application No. 201910038703.6, filed on Jan. 11, 2019, and entitled "PHOTOSENSITIVE COMPONENT, X-RAY DETECTOR AND DISPLAY DEVICE", the entire disclosure of which is incorporated herein by reference.

TECHNICAL FIELD

The present disclosure relates to the technical field of detectors, in particular to a photosensitive component, an X-ray detector and a display device.

BACKGROUND

The statements here only provide background information related to the present disclosure, and do not necessarily constitute related art.

X-ray detectors are widely used in medical instruments, such as chest X-ray imaging using X-rays. In the exemplary technology, the photoelectric conversion of the X-ray detector is mainly completed by the amorphous silicon photosensitive layer. X-rays are converted into visible light by the scintillator (currently mainly CsI), and then the visible light is converted into electrical signals by the amorphous silicon photosensitive layer, and the electrical signals are output by the signal reading device (Thin film transistor, TFT for short). Since the structure of amorphous silicon is not stable enough and the light conversion efficiency is low, causing the amorphous silicon photosensitive layer absorbs a wide range of light waves and is not sensitive to light conversion, which directly affects the photoelectric conversion efficiency of the X-ray detector.

SUMMARY

The main objective of the present disclosure is to provide a photosensitive component, an X-ray detector and a display device, which aims to improve the range of light waves absorbed by the amorphous silicon photodiode and the conversion sensitivity to light.

In order to achieve the above objective, the present disclosure provides a photosensitive component, including:
an intrinsic layer;
a first doped layer provided on a light incident side of the intrinsic layer; and
a second doped layer provided on a light exit side of the intrinsic layer;
the intrinsic layer, the first doped layer and the second doped layer are all doped with a dopant, and silicon ions are injected into the intrinsic layer, the first doped layer and the second doped layer.

In an embodiment, the dopant includes at least one of $SiN_x$, $SiO_xC_y$, $SiC_x$, or $SiO_xN_y$.

In an embodiment, the first doped layer is further doped with a P-type dopant.

In an embodiment, the first doped layer is further doped with an N-type dopant.

In an embodiment, the photosensitive component absorbs light with a wavelength between 400 nm and 670 nm.

In an embodiment, the photosensitive component absorbs visible light.

In an embodiment, the photosensitive component further includes a first electrode layer and a second electrode layer; the second doped layer, the intrinsic layer and the first doped layer are stacked on the first electrode layer from bottom to top; and the second electrode layer is provided on the first doped layer.

In an embodiment, the X-ray detector includes a substrate and a photosensitive component provided on the substrate, the photosensitive component including:
an intrinsic layer;
a first doped layer provided on a light incident side of the intrinsic layer; and
a second doped layer provided on a light exit side of the intrinsic layer;
the intrinsic layer, the first doped layer and the second doped layer are all doped with a dopant, and silicon ions are injected into the intrinsic layer, the first doped layer and the second doped layer;
the X-ray detector further includes:
a light conversion layer provided on a light incident side of the X-ray detector and for converting X-rays into visible light, the photosensitive component for receiving an optical signal of the visible light and converting the optical signal into an electrical signal;
a signal reading element provided on the substrate and electrically connected to the photosensitive component to receive and read the electrical signal converted by the photosensitive component; and
a light shielding layer located between the light conversion layer and the signal reading element, to shield visible light converted by the light conversion layer from being incident on the signal reading element.

In an embodiment, the dopant includes at least one of $SiN_x$, $SiO_xC_y$, $SiC_x$, or $SiO_xN_y$.

In an embodiment, the photosensitive component absorbs light with a wavelength between 400 nm and 670 nm.

In an embodiment, the photosensitive component further includes a substrate, a first electrode layer and a second electrode layer; the first electrode layer is provided on the substrate; the second doped layer, the intrinsic layer and the first doped layer are stacked on the first electrode layer from bottom to top; and the second electrode layer is provided on the first doped layer.

In an embodiment, the X-ray detector further includes a protective layer filling a gap between the signal reading element and the light conversion layer to isolate the light shielding layer, the signal reading element and the photosensitive component from an external environment.

In an embodiment, the light conversion layer is a cesium iodide scintillator arranged in a columnar shape.

In an embodiment, the light conversion layer is attached to a side of the protection layer away from the signal reading element.

In an embodiment, the light conversion layer absorbs light with a wavelength between 420 nm and 560 nm.

In an embodiment, the signal reading element is a thin film transistor structure.

In an embodiment, a display device includes an X-ray detector, the X-ray detector including a substrate and a photosensitive component provided on the substrate, the photosensitive component including:
an intrinsic layer;
a first doped layer provided on a light incident side of the intrinsic layer; and a second doped layer provided on a light exit side of the intrinsic layer;

the intrinsic layer, the first doped layer and the second doped layer are all doped with a dopant, and silicon ions are injected into the intrinsic layer, the first doped layer and the second doped layer;

the X-ray detector further includes:

a light conversion layer provided on a light incident side of the X-ray detector and for converting X-rays into visible light, the photosensitive component for receiving an optical signal of the visible light and converting the optical signal into an electrical signal;

a signal reading element provided on the substrate and electrically connected to the photosensitive component to receive and read the electrical signal converted by the photosensitive component; and a light shielding layer located between the light conversion layer and the signal reading element, to shield visible light converted by the light conversion layer from being incident on the signal reading element;

the display device further including an imaging device electrically connected to the signal reading element.

The present disclosure provides a photosensitive component, an X-ray detector and a display device. The photosensitive component includes an intrinsic layer; a first doped layer provided on a light incident side of the intrinsic layer; and a second doped layer provided on a light exit side of the intrinsic layer. The intrinsic layer, the first doped layer and the second doped layer are all doped with a dopant, and silicon ions are injected into the intrinsic layer, the first doped layer and the second doped layer. As such, in technical solutions of the present disclosure, the contact area of light can be increased by injecting silicon ions into the photosensitive component, thereby increasing the sensitivity of the photosensitive component to light, such that the photoelectric conversion performance of the photosensitive component is better, and the photoelectric conversion efficiency of the photosensitive component is higher.

BRIEF DESCRIPTION OF THE DRAWINGS

In order to more clearly illustrate the embodiments of the present disclosure, drawings used in the embodiments will be briefly described below. Obviously, the drawings in the following description are only some embodiments of the present disclosure. It will be apparent to those skilled in the art that other figures can be obtained according to the structures shown in the drawings without creative work.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that, if there are directional indications (such as up, down, left, right, front, rear . . . ) in the embodiments of the present disclosure, the directional indication is only used to explain the relative positional relationship, movement, etc. between the various components in a specific posture (as shown in the figure). If the specific posture changes, the directional indication will change accordingly.

In addition, the descriptions associated with, e.g., "first" and "second," in the present disclosure are merely for descriptive purposes, and cannot be understood as indicating or suggesting relative importance or impliedly indicating the number of the indicated technical feature. Therefore, the feature associated with "first" or "second" can expressly or impliedly include at least one such feature. Besides, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

Figure 1:
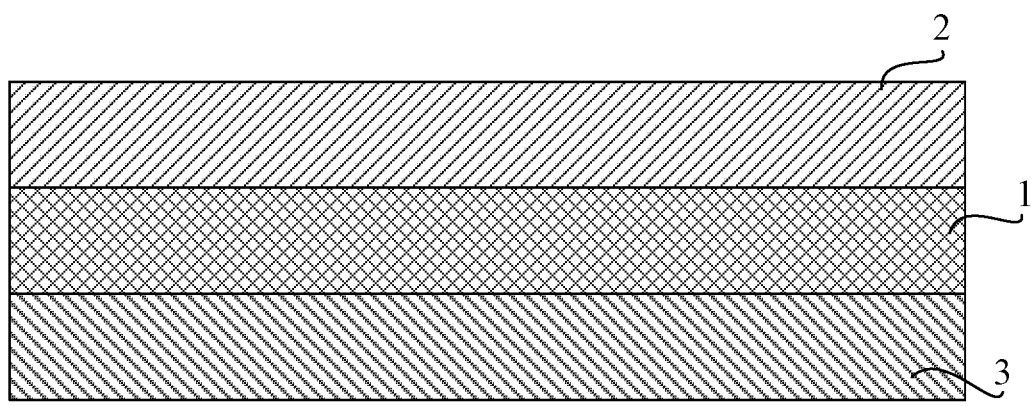
FIG. 1 is a schematic structural diagram of a photosensitive component according to an embodiment of the present disclosure.

The embodiments of the present disclosure provide a photosensitive component. As shown in FIG. 1, FIG. 1 shows a schematic structural diagram of a photosensitive component according to an embodiment of the present disclosure. The photosensitive component includes an intrinsic layer 1, a first doped layer 2 and a second doped layer 3. The second doped layer 3, the intrinsic layer 1 and the first doped layer 2 are sequentially stacked from bottom to top, and form a PIN structure. That is, in a specific embodiment, the photosensitive component is a PIN-type photodiode for sensing an intensity of light and convert an optical signal of the light into an electrical signal, thereby transmitting the electrical signal to the signal reading element 8.

In an embodiment, the second doped layer 3 can be used as a first electrode of the photosensitive component, and the first doped layer 2 can be used as a second electrode of the photosensitive component. The first electrode is electrically connected to the signal reading element 8 to transmit the electrical signal to the signal reading element 8.

Figure 2:
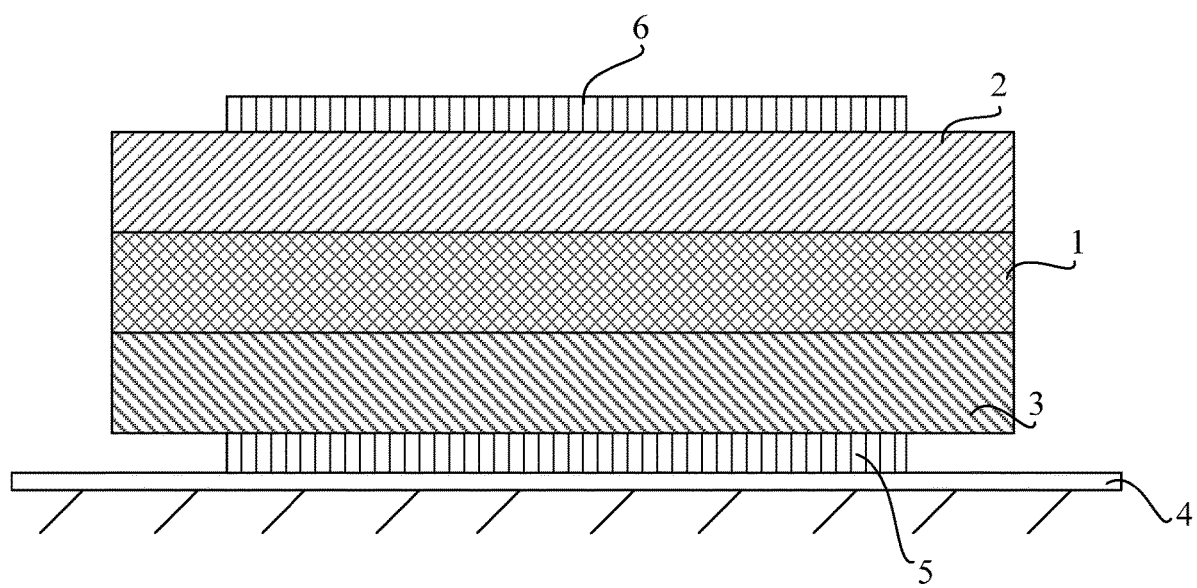
FIG. 2 is a schematic structural diagram of the photosensitive component according to another embodiment of the present disclosure.

However, in other embodiments, as shown in FIG. 2, the photosensitive component further includes a substrate 4, a first electrode layer 5 and a second electrode layer 6. The first electrode layer 5 is provided on the substrate 4, and the second doped layer 3, the intrinsic layer 1 and the first doped layer 2 are stacked on the first electrode layer 5 from bottom to top. The second electrode layer 6 is provided on the first doped layer 2. Specifically, the substrate 4 supports the entire photosensitive component, and the first electrode layer 5 transmits the electrical signal converted by the photosensitive component to the signal reading element 8, that is, the first electrode layer 5 is electrically connected to the signal transmission element.

In this embodiment, the first doped layer 2 is provided on the light incident side of the intrinsic layer 1, and the second doped layer 3 is provided on the light exit side of the intrinsic layer 1.

In an embodiment, the intrinsic layer 1, the first doped layer 2 and the second doped layer 3 are all doped with a dopant, and silicon ions are injected into the intrinsic layer 1, the first doped layer 2 and the second doped layer 3. Specifically, the dopant is an insulating dopant, that is, the intrinsic layer 1, the first doped layer 2, and the second doped layer 3 are non-conductive. Therefore, in this embodiment, silicon ions are injected into the intrinsic layer 1, the first doped layer 2 and the second doped layer 3, such that the structures of the intrinsic layer 1, the first doped layer 2 and the second doped layer 3 are changed. When the injected silicon ions reach a predetermined amount, the dopant changes from an insulating dopant to a semiconductor dopant, that is, the intrinsic layer 1, the first doped layer 2, and the second doped layer 3 are conductive to transmit photoelectric signals. In this embodiment, the predetermined amount of the injected silicon ions can be determined according to the temperature and pressure as long as the intrinsic layer 1, the first doped layer 2 and the second doped layer 3 can be changed into a semiconductor structure to conduct photoelectric signals, there is no limitation here.

Specifically, the first doped layer 2 is the second electrode and is electrically connected to the intrinsic layer 1. When a voltage is applied across the first doped layer 2 and the second doped layer 3, light enters the intrinsic layer 1 from the first doped layer 2. The intrinsic layer 1 will detect the intensity of light and convert the optical signal of the light into the electrical signal. The electrical signal is transmitted from the second doped layer 3 to the signal reading element 8, that is, from the first electrode to the signal reading element 8.

In an embodiment, the incident light received by the photosensitive component may be visible light.

In some embodiments of the present disclosure, the first doped layer 2 and the second doped layer 3 are all doped with a dopant, and silicon ions are injected into the intrinsic layer 1, the first doped layer 2 and the second doped layer 3, such that the intrinsic layer 1, the first doped layer 2 and the second doped layer 3 are turned into semiconductor structures to conduct photoelectric signals. In an embodiment of the present disclosure, a contact area of light can be increased by injecting silicon ions into the photosensitive component, thereby increasing the sensitivity of the photosensitive component to light, such that the photoelectric conversion performance of the photosensitive component is better, and the photoelectric conversion efficiency of the photosensitive component is higher.

In an embodiment, the dopant is $SiN_x$ (silicon nitride). Silicon nitride has an insulating crystal structure, that is, in this embodiment, silicon ions need to be injected into the intrinsic layer 1, the first doped layer 2, and the second doped layer 3 to change the structure of silicon nitride. Thus, the intrinsic layer 1, the first doped layer 2 and the second doped layer 3 are changed into semiconductor structures to conduct photoelectric signals.

Specially, in the silicon nitride dopant, the concentration of nitrogen ions can be changed by changing the value of X. The value of X in this embodiment is 0.1 to 1.33. That is, when the value of X changes, the concentrations of nitrogen ions and silicon ions in silicon nitride changes. For example, when X is 0.1, a concentration ratio of nitrogen ions and silicon ions in silicon nitride is 1:10. When X is 0.2, the concentration ratio of nitrogen ions and silicon ions in silicon nitride is 1:5. By analogy, by changing the value of X, the concentration ratio of nitrogen ions and silicon ions in silicon nitride can be changed, thereby changing the wavelength of light absorbed by the photosensitive component. That is, in this embodiment, the photosensitive component absorbs light with a wavelength between 400 nm and 670 nm, whose specific value is adjusted according to the concentration ratio of nitrogen ion and silicon ion in the silicon nitride, thereby improving the light sensitivity of the photosensitive component.

In other embodiments, the dopant may also be at least one of $SiO_xC_y$ (silicon oxycarbide), $SiC_x$ (silicon carbide), and $SiO_xN_y$ (silicon oxynitride). The specific effect achieved is the same as that of silicon nitride, and will not be repeated here.

In an embodiment, concentrations of oxygen ions and carbon ions in silicon oxycarbide can be adjusted according to the values of X and Y, that is, the values of X and Y in silicon oxycarbide are both 0.1 to 1.0. That is, by changing the values of X and Y, a concentration ratio of carbon ions and oxygen ions in the silicon oxycarbide can be changed, thereby changing the wavelength of light absorbed by the photosensitive component. That is, in this embodiment, the photosensitive component absorbs light with a wavelength between 400 nm and 670 nm, whose specific value is adjusted according to the concentration ratio of carbon ions and oxygen ions in silicon nitride, thereby improving the light sensitivity of the photosensitive component.

In an embodiment, the concentration of carbon ions in silicon carbide can be adjusted according to the value of X, that is, the value of X in silicon carbide is 0.1 to 1.0. That is, the concentration of carbon ions in the silicon oxycarbide can be changed by changing the value of X, so that the concentration ratio of carbon ions and oxygen ions is changed, thereby changing the wavelength of light absorbed by the photosensitive component. That is, in this embodiment, the photosensitive component absorbs light with a wavelength between 400 nm and 670 nm, whose specific value is adjusted according to the concentration ratio of carbon ions and oxygen ions in the silicon nitride, thereby improving the light sensitivity of the photosensitive component.

In an embodiment, concentrations of oxygen ions and nitrogen ions in silicon oxynitride can be adjusted according to the values of X and Y, that is, the value of X in silicon oxycarbide is 0.1 to 1.5, and the value of Y is 0.1 to 1.3. That is, by changing the values of X and Y, the concentration ratio of oxygen ions and nitrogen ions in the silicon oxynitride can be changed, thereby changing the wavelength of light absorbed by the photosensitive component. That is, in this embodiment, the photosensitive component absorbs light with a wavelength between 400 nm and 670 nm, whose specific value is adjusted according to the concentration ratio of carbon ions and oxygen ions in the silicon nitride, thereby improving the light sensitivity of the photosensitive component.

In a specific embodiment, the dopant is one or a combination of two or more of $SiN_x$, $SiO_xC_y$, $SiC_x$, and $SiO_xN_y$, and the wavelength of light absorbed by the photosensitive component can be adjusted by changing the concentration of each type of ions between the dopant, thereby improving the light sensitivity of the photosensitive component. In this embodiment, the photosensitive component absorbs light with a wavelength between 400 nm to 670 nm, that is, the light absorbed by the photosensitive component is visible light.

In a specific embodiment, since the photosensitive component is a PIN-type photodiode, the first doped layer 2 is also doped with a P-type dopant, that is, the first doped layer 2 forms a P-type semiconductor. The second doped layer 3 is also doped with an N-type dopant, and the second doped layer 3 forms an N-type semiconductor. That is, the first doped layer 2 is doped with the P-type dopant and the second doped layer 3 is doped with the N-type dopant, the performance and stability of the first doped layer 2 and the second doped layer 3 can be improved, thereby improving the performance and stability of the photosensitive component.

In an embodiment, the P-type dopant is boron ions, and optionally, the P-type dopant is a $B_2H_6$ (hydrogen boride) compound.

In an embodiment, the N-type dopant is phosphorus ions, and optionally, the P-type dopant is a $PH_3$ (phosphine) compound.

In some embodiments of the present disclosure, the intrinsic layer 1, the first doped layer 2 and the second doped layer 3 are all doped with a dopant, and silicon ions are injected into the intrinsic layer 1, the first doped layer 2 and the second doped layer 3, such that the intrinsic layer 1, the first doped layer 2 and the second doped layer 3 are turned into semiconductor structures to conduct photoelectric signals. The photosensitive component of the embodiments of the present disclosure has more sensitive photoelectric conversion performance, so that the photoelectric conversion efficiency of the photosensitive component is higher.

Figure 3:
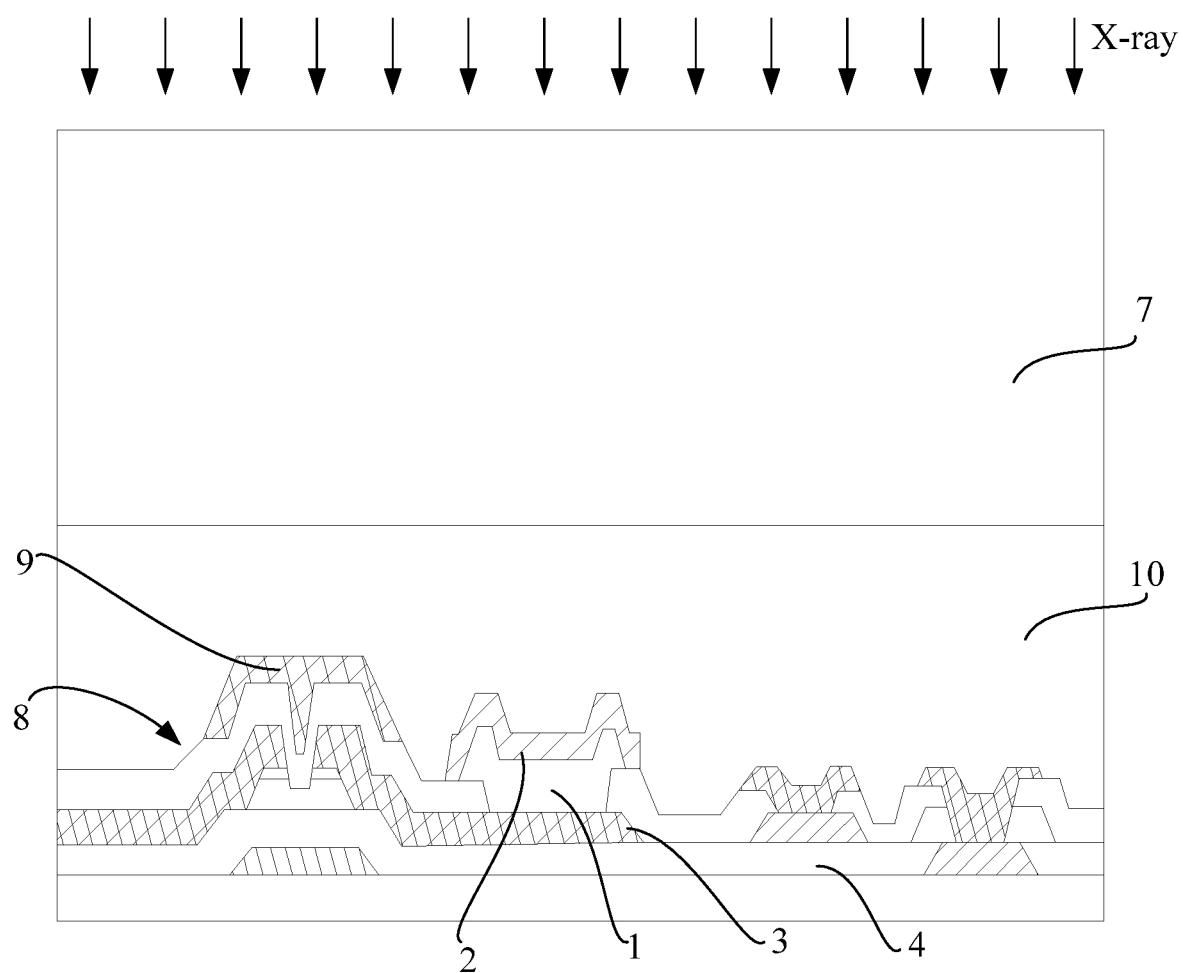
FIG. 3 is a schematic structural diagram of an X-ray detector according to an embodiment of the present disclosure.

Based on the above embodiments, another embodiment of the present disclosure further provides an X-ray detector. As shown in FIG. 3, the X-ray detector includes a substrate 4 and the photosensitive component in the above embodiment. The photosensitive component is provided on the substrate 4. The second doped layer 3 of the photosensitive component is provided on the substrate 4, or the second electrode of the photosensitive component is provided on the substrate 4. In an embodiment, the substrate 4 may be a glass substrate 4, a silicon wafer, a polyimide PI plastic substrate 4, etc., which are not limited herein.

In an embodiment, as shown in FIGS. 1 and 2, a photosensitive component includes an intrinsic layer 1; a first doped layer 2 provided on a light incident side of the intrinsic layer 1; and a second doped layer 3 provided on a light exit side of the intrinsic layer 1. The intrinsic layer 1, the first doped layer 2 and the second doped layer 3 are all doped with a dopant, and silicon ions are injected into the intrinsic layer 1, the first doped layer 2 and the second doped layer 3.

Specifically, the dopant is an insulating dopant, that is, the intrinsic layer 1, the first doped layer 2, and the second doped layer 3 are non-conductive. Therefore, in this embodiment, silicon ions are injected into the intrinsic layer 1, the first doped layer 2 and the second doped layer 3, such that the structures of the intrinsic layer 1, the first doped layer 2 and the second doped layer 3 are changed. When the injected silicon ions reach a predetermined amount, the dopant changes from an insulating dopant to a semiconductor dopant, that is, the intrinsic layer 1, the first doped layer 2, and the second doped layer 3 are conductive to transmit photoelectric signals. In this embodiment, the predetermined amount of the injected silicon ions can be determined according to the temperature and pressure as long as the intrinsic layer 1, the first doped layer 2 and the second doped layer 3 can be changed into a semiconductor structure to conduct photoelectric signals, there is no limitation here.

Further, the dopant includes at least one of $SiN_x$, $SiO_xC_y$, $SiC_x$, or $SiO_xN_y$.

Further, the photosensitive component absorbs light with a wavelength between 400 nm and 670 nm.

Further, as shown in FIG. 2, the photosensitive component further includes a substrate 4, a first electrode layer 5 and a second electrode layer 6. The first electrode layer 5 is provided on the substrate 4. The second doped layer 3, the intrinsic layer 1 and the first doped layer 2 are stacked on the first electrode layer 5 from bottom to top. The second electrode layer 6 is provided on the first doped layer 2. Specifically, the substrate 4 supports the entire photosensitive component, and the first electrode layer 5 transmits the electrical signal converted by the photosensitive component to the signal reading element 8, that is, the first electrode layer 5 is electrically connected to the signal transmission element, so that the photosensitive component is connected to the signal reading element 8 through the first electrode layer 5 and the second electrode layer 6.

In a specific embodiment, the X-ray detector further includes a light conversion layer 7, a signal reading element 8 and a light shielding layer 9. Specifically, the light conversion layer 7 is provided on the light incident side of the X-ray detector and converts X-rays into visible light, and the photosensitive component receives the optical signal of the visible light and converts the optical signal into an electrical signal. The signal reading element 8 is provided on the substrate 4 and is electrically connected to the photosensitive component to receive and read the electrical signal converted by the photosensitive component. The light shielding layer 9 is located between the light conversion layer 7 and the signal reading element 8 to shield the visible light converted by the light conversion layer 7 from being incident on the signal reading element 8.

In an embodiment, the signal reading element 8 may be a Thin Film Transistor (TFT) structure for reading the electrical signal of the photosensitive component, and the electrical signal is a current signal.

In an embodiment, an X-ray generator (not shown) is further provided on the X-ray detector. The X-ray generator emits X-rays. The X-ray detector is provided on the light incident side of the X-ray generator, that is, the light conversion layer 7 is provided on the light incident side of the X-ray detector. Specifically, the light conversion layer 7 is a cesium iodide scintillator arranged in a columnar shape, which converts X-rays into visible light and irradiates the photosensitive component.

In an embodiment, the light conversion layer 7 absorbs light with a wavelength between 420 nm and 560 nm. Other dopants may be doped in the light conversion layer 7 to absorb visible light with a specific wavelength. For example, doping with thallium ions in the light conversion layer 7 can absorb visible light with a wavelength of 550 nm.

In an embodiment, the drain of the signal reading element 8 is provided on the substrate 4 and is electrically connected to the second doped layer 3 of the photosensitive component to conduct electrical signals. Of course, in this embodiment, the drain of the signal reading element 8 and the second doped layer 3 of the photosensitive component are common electrodes, so that the conduction of electrical signals is more efficient and faster.

In an embodiment, the light shielding layer 9 is provided between the light conversion layer 7 and the signal reading element 8, such that the visible light converted by the light conversion layer 7 is blocked from irradiating the active layer of the signal reading element 8, thereby destroying the efficiency of the entire signal reading element 8.

In a specific embodiment, the X-ray detector further includes a protective layer 10 filling a gap between the signal reading element 8 and the light conversion layer 7 to isolate the light shielding layer 9, the signal reading element 8 and the photosensitive component from an external environment.

In order to prevent the loss of electrical signals, the components of the X-ray detector need to be strictly isolated from the external environment. Therefore, the protective layer 10 fills the gap between the signal reading element 8 and the light conversion layer 7 to isolate the light shielding layer 9, the signal reading element 8 and the photosensitive component from the external environment.

In an embodiment, the light conversion layer 7 is attached to a side of the protective layer 10 away from the signal reading element. The protection layer 10 supports the light conversion layer 7, which increases the compatibility between the light conversion layer 7 and the protection layer 10, reduces the loss of visible light converted by the light conversion layer 7, and thus can improve the utilization rate of light. Specifically, the cesium iodide scintillator can also be deposited on a substrate through chemical vapor deposition to form a light conversion film, which is attached to the protective layer 10. Optionally, the light conversion film may be attached to the protective layer 10 by glue, double-sided tape or other stickers, which is not limited in the present disclosure.

In an embodiment, the cesium iodide in the light conversion layer 7 can be directly deposited on the protective layer 10 by chemical vapor deposition. For example, the cesium iodide can be directly heated to the melting point to make the cesium iodide gas, and then deposited on the protective layer 10. The compatibility between the light conversion layer 7 and the protective layer 10 can also be increased, and the loss of visible light converted by the light conversion layer 7 can be reduced, which can improve the utilization rate of light.

In an embodiment, through providing the photosensitive component on the side of the signal reading element 8, the photosensitive component can receive visible light irradiation in a large area without being limited by the signal reading element 8 and has a high photoelectric conversion efficiency. When the X-ray detector is applied to a display device, the arrangement of the photosensitive component between the light conversion layer 7 and the light shielding layer 9 can reduce the irradiation time under X-rays or reduce the irradiation intensity of X-rays. Since the X-ray detector has a high photoelectric conversion efficiency, it can achieve the same imaging effect, thus reducing the influence of X-rays.

The X-ray detector of the present disclosure adopts the photosensitive component of the above-mentioned embodiment, and the contact area of light may be increased by injecting silicon ions into the photosensitive component, thereby increasing the sensitivity of the photosensitive component to light, such that the photoelectric conversion performance of the photosensitive component is better, and the photoelectric conversion efficiency of the photosensitive component is higher, that is, the photoelectric conversion efficiency of the X-ray detector is improved.

Based on all the above embodiments, as shown in FIGS. 1 to 3, the embodiment of the present disclosure also provides a display device. The display device includes the aforementioned X-ray detector and imaging device (not shown). The X-ray detector is electrically connected to the imaging device. The electric signal generated by the X-ray detector due to the photoelectric effect forms an image through the imaging device.

In an embodiment, as shown in FIG. 3, the X-ray detector includes a substrate 4 and the photosensitive component in the above embodiment. The photosensitive component is provided on the substrate 4. The second doped layer 3 of the photosensitive component is provided on the substrate 4, or the second electrode of the photosensitive component is provided on the substrate 4. In an embodiment, the substrate 4 may be a glass substrate 4, a silicon wafer, a polyimide PI plastic substrate 4, etc., which are not limited herein.

Further, as shown in FIGS. 1 and 2, a photosensitive component includes an intrinsic layer 1; a first doped layer 2 provided on a light incident side of the intrinsic layer 1; and a second doped layer 3 provided on a light exit side of the intrinsic layer 1. The intrinsic layer 1, the first doped layer 2 and the second doped layer 3 are all doped with a dopant, and silicon ions are injected into the intrinsic layer 1, the first doped layer 2 and the second doped layer 3.

Specifically, the dopant is an insulating dopant, that is, the intrinsic layer 1, the first doped layer 2, and the second doped layer 3 are non-conductive. Therefore, in this embodiment, silicon ions are injected into the intrinsic layer 1, the first doped layer 2 and the second doped layer 3, such that the structures of the intrinsic layer 1, the first doped layer 2 and the second doped layer 3 are changed. When the injected silicon ions reach a predetermined amount, the dopant changes from an insulating dopant to a semiconductor dopant, that is, the intrinsic layer 1, the first doped layer 2, and the second doped layer 3 are conductive to transmit photoelectric signals. In this embodiment, the predetermined amount of the injected silicon ions can be determined according to the temperature and pressure as long as the intrinsic layer 1, the first doped layer 2 and the second doped layer 3 can be changed into a semiconductor structure to conduct photoelectric signals, there is no limitation here.

In a specific embodiment, as shown in FIG. 3, the X-ray detector further includes a light conversion layer 7, a signal reading element 8 and a light shielding layer 9. Specifically, the light conversion layer 7 is provided on the light incident side of the X-ray detector and converts X-rays into visible light, and the photosensitive component receives the optical signal of the visible light and converts the optical signal into an electrical signal. The signal reading element 8 is provided on the substrate 4 and is electrically connected to the photosensitive component to receive and read the electrical signal converted by the photosensitive component. The light shielding layer 9 is located between the light conversion layer 7 and the signal reading element 8 to shield the visible light converted by the light conversion layer 7 from being incident on the signal reading element 8.

In this embodiment, since the photosensitive component with the photoelectric conversion function in the X-ray detector has sensitive and efficient photoelectric conversion performance, under the same imaging effect, the irradiation intensity or irradiation time of X-rays can be reduced, and the influence of long-term X-ray irradiation can be reduced.

The technical solutions of the present disclosure adopt the above X-ray detector. The contact area of light may be increased by injecting silicon ions into the photosensitive component of the X-ray detector, thereby increasing the sensitivity of the photosensitive component to light, such that the photoelectric conversion performance of the photosensitive component is better, and the photoelectric conversion efficiency of the photosensitive component is higher, that is, the photoelectric conversion efficiency of the X-ray detector is improved.

The above are only optional embodiments of the present disclosure, and do not limit the scope of the present disclosure. Under the inventive concept of the present disclosure, any equivalent structural transformations made using the contents of the description and drawings of the present disclosure, or direct/indirect application in other related technical fields are included in the scope of the present disclosure.

What is claimed is:

1. A photosensitive component, comprising:
   an intrinsic layer;
   a first doped layer provided on a light incident side of the intrinsic layer; and
   a second doped layer provided on a light exit side of the intrinsic layer;
   wherein the intrinsic layer, the first doped layer and the second doped layer are all doped with a dopant, and silicon ions are injected into the intrinsic layer, the first doped layer and the second doped layer;
   the dopant comprises at least one of SiNx, SiOxCy, SiCx, or SiOxNy; a value of X in SiNx is 0.1 to 1.33; a value of X and a value of Y in SiOxCy are both 0.1 to 1.0, a value of X in SiCx is 0.1 to 1.0, and a value of X in SiOxNy is 0.1 to 1.5 and a value of Y in SiOxNy is 0.1 to 1.3.

2. The photosensitive component of claim 1, wherein the first doped layer is further doped with a P-type dopant.

3. The photosensitive component of claim 1, wherein the first doped layer is further doped with an N-type dopant.

4. The photosensitive component of claim 1, wherein the photosensitive component absorbs light with a wavelength between 400 nm and 670 nm.

5. The photosensitive component of claim 1, wherein the photosensitive component absorbs visible light.

6. The photosensitive component of claim 1, wherein:
   the photosensitive component further comprises a first electrode layer and a second electrode layer;
   the second doped layer, the intrinsic layer and the first doped layer are stacked on the first electrode layer from bottom to top; and
   the second electrode layer is provided on the first doped layer.

7. An X-ray detector, comprising:
   a substrate;
   a photosensitive component provided on the substrate, the photosensitive component comprising:
      an intrinsic layer;
      a first doped layer provided on a light incident side of the intrinsic layer; and
      a second doped layer provided on a light exit side of the intrinsic layer;
      wherein the intrinsic layer, the first doped layer and the second doped layer are all doped with a dopant, and silicon ions are injected into the intrinsic layer, the first doped layer and the second doped layer;
      the dopant comprises at least one of SiNx, SiOxCy, SiCx, or SiOxNy; a value of X in SiNx is 0.1 to 1.33; a value of X and a value of Y in SiOxCy are both 0.1 to 1.0, a value of X in SiCx is 0.1 to 1.0, and a value of X in SiOxNy is 0.1 to 1.5 and a value of Y in SiOxNy is 0.1 to 1.3;
   a light conversion layer provided on a light incident side of the X-ray detector and for converting X-rays into visible light, the photosensitive component for receiving an optical signal of the visible light and converting the optical signal into an electrical signal;
   a signal reading element provided on the substrate and electrically connected to the photosensitive component to receive and read the electrical signal converted by the photosensitive component; and
   a light shielding layer located between the light conversion layer and the signal reading element, to shield visible light converted by the light conversion layer from being incident on the signal reading element.

8. The X-ray detector of claim 7, wherein the photosensitive component absorbs light with a wavelength between 400 nm and 670 nm.

9. The X-ray detector of claim 7, wherein:
   the photosensitive component further comprises a substrate, a first electrode layer and a second electrode layer;
   the first electrode layer is provided on the substrate;
   the second doped layer, the intrinsic layer and the first doped layer are stacked on the first electrode layer from bottom to top; and
   the second electrode layer is provided on the first doped layer.

10. The X-ray detector of claim 7, wherein the X-ray detector further comprises a protective layer filling a gap between the signal reading element and the light conversion layer to isolate the light shielding layer, the signal reading element and the photosensitive component from an external environment.

11. The X-ray detector of claim 10, wherein the light conversion layer is a cesium iodide scintillator arranged in a columnar shape.

12. The X-ray detector of claim 11, wherein the light conversion layer is attached to a side of the protection layer away from the signal reading element.

13. The X-ray detector of claim 12, wherein the light conversion layer absorbs light with a wavelength between 420 nm and 560 nm.

14. The X-ray detector of claim 7, wherein the signal reading element is a thin film transistor structure.

15. A display device, comprising:
   an X-ray detector, comprising:
      a substrate; and
      a photosensitive component provided on the substrate, the photosensitive component comprising:
         an intrinsic layer;
         a first doped layer provided on a light incident side of the intrinsic layer; and
         a second doped layer provided on a light exit side of the intrinsic layer;
         wherein the intrinsic layer, the first doped layer and the second doped layer are all doped with a dopant, and silicon ions are injected into the intrinsic layer, the first doped layer and the second doped layer;
         the dopant comprises at least one of SiNx, SiOxCy, SiCx, or SiOxNy; a value of X in SiNx is 0.1 to 1.33; a value of X and a value of Y in SiOxCy are both 0.1 to 1.0, a value of X in SiCx is 0.1 to 1.0, and a value of X in SiOxNy is 0.1 to 1.5 and a value of Y in SiOxNy is 0.1 to 1.3;
      a light conversion layer provided on a light incident side of the X-ray detector and for converting X-rays into visible light, the photosensitive component for receiving an optical signal of the visible light and converting the optical signal into an electrical signal;
      a signal reading element provided on the substrate and electrically connected to the photosensitive component to receive and read the electrical signal converted by the photosensitive component; and
      a light shielding layer located between the light conversion layer and the signal reading element, to shield visible light converted by the light conversion layer from being incident on the signal reading element; and an imaging device electrically connected to the signal reading element.

* * * * *